(12) United States Patent
Nomura et al.

(10) Patent No.: US 10,123,416 B2
(45) Date of Patent: Nov. 6, 2018

(54) VEHICULAR WIRING STRUCTURE

(71) Applicant: YAZAKI CORPORATION, Tokyo (JP)

(72) Inventors: Shoichi Nomura, Shizuoka (JP); Gaku Ito, Shizuoka (JP); Taku Furuta, Shizuoka (JP); Shuji Kimura, Shizuoka (JP); Tomoaki Sasaki, Shizuoka (JP); Masahiro Ito, Shizuoka (JP); Mitsunori Tsunoda, Shizuoka (JP); Eiji Shimochi, Shizuoka (JP)

(73) Assignee: YAZAKI CORPORATION, Minato-ku, Tokyo (JP)

( * ) Notice: Subject to any disclaimer, the term of this patent is extended or adjusted under 35 U.S.C. 154(b) by 41 days.

(21) Appl. No.: 15/412,292

(22) Filed: Jan. 23, 2017

(65) Prior Publication Data

US 2017/0215285 A1     Jul. 27, 2017

(30) Foreign Application Priority Data

Jan. 26, 2016   (JP) .................................. 2016-012201

(51) Int. Cl.
| B60L 1/00  | (2006.01) |
| H02G 3/00  | (2006.01) |
| H05K 1/11  | (2006.01) |
| B60R 16/02 | (2006.01) |
| H05K 1/02  | (2006.01) |
| B60R 13/02 | (2006.01) |

(52) U.S. Cl.
CPC .............. *H05K 1/119* (2013.01); *B60R 13/02* (2013.01); *B60R 16/0207* (2013.01); *B60R 16/0215* (2013.01); *H05K 1/0284* (2013.01); *B60R 2013/0287* (2013.01)

(58) Field of Classification Search
CPC ...... H05K 1/119; H05K 1/0284; B60R 13/02; B60R 16/0207; B60R 16/0215; B60R 2013/0287; B60L 1/00; H02G 3/00
USPC ................................................. 307/9.1, 10.1
See application file for complete search history.

(56) References Cited

U.S. PATENT DOCUMENTS

| 6,257,897 B1 | 7/2001 | Kubota |
| 2006/0223316 A1 | 10/2006 | Baik et al. |
| 2012/0001457 A1 | 1/2012 | VanHouten et al. |

FOREIGN PATENT DOCUMENTS

| JP | 56-154316 A | 11/1981 |
| JP | 4-85776 U | 7/1992 |
| JP | 0577659 A | 3/1993 |
| JP | 5-69990 U | 9/1993 |
| JP | 2000294044 A | 10/2000 |
| JP | 2006-076020 A | 3/2006 |
| JP | 2006/287217 A | 10/2006 |

(Continued)

OTHER PUBLICATIONS

Communication dated Mar. 6, 2018, from the Japanese Patent Office in counterpart application No. 2016-012201.

(Continued)

*Primary Examiner* — Hal Kaplan
(74) *Attorney, Agent, or Firm* — Sughrue Mion, PLLC

(57) ABSTRACT

A vehicular wiring structure includes a panel and a printed wiring part. The printed wiring part is arranged such that in a flat face of the panel, a conductive member is printed on the flat face directly. The printed wiring part is arranged such that in a non-flat face of the panel, a film on which a conductive member is printed is pasted to the non-flat face.

4 Claims, 18 Drawing Sheets

(56) References Cited

FOREIGN PATENT DOCUMENTS

| | | | |
|---|---|---|---|
| JP | 2006306181 | A | 11/2006 |
| JP | 2007150047 | A | 6/2007 |
| JP | 4432501 | B2 | 3/2010 |
| JP | 2010/167926 | A | 8/2010 |
| JP | 2012-514560 | A | 6/2012 |

OTHER PUBLICATIONS

Communication dated Sep. 11, 2018, from the Japanese Patent Office in counterpart application No. 2016-012201.

VEHICULAR WIRING STRUCTURE

CROSS REFERENCE TO RELATED APPLICATION

The present application is based on, and claims priority from Japanese Patent Application No. 2016-012201, filed Jan. 26, 2016, the disclosure of which is hereby incorporated by reference herein in its entirety.

TECHNICAL FIELD

The present application relates to a vehicular wiring structure where a conductive member is arranged along a wiring path of a vehicle.

RELATED ART

On a vehicle, there are mounted a variety of electric components to be electrically connected with each other. A wire harness has been generally adopted for such a vehicular wiring between the electric components. However, the wire harness is composed of a bundle of electrical wires and also apt to occupy a large wiring space. In this situation, JP 4432501 B proposes a technique of printing a wiring part of conductive ink or the like on a vehicle body directly.

As illustrated in FIG. 23, this conventional technique has an advantage that if only forming a printed wiring part 101 on an instrument panel 100 directly, then there is almost no need of ensuring a wiring space for electrical wires.

SUMMARY

Similarly to the instrument panel 100, however, a wired member to be wired on a vehicle generally has a three-dimensional structure composed of flat faces and non-flat faces in mixture. If the wired member is provided with flat faces only, it would be possible to print conductive ink on the flat faces by such as means of spraying precisely and rapidly. However, as the wired member is actually provided with flat faces and non-flat faces in mixture, there arises a problem that the conductive ink cannot be printed on the non-flat face precisely and rapidly by such as means of spraying.

In consideration of the above-mentioned situation, an object of the present application is to provide, for a wired member to be wired on a vehicle having flat faces and non-flat faces in mixture, a vehicular wiring structure, which allows a printed wiring part to be arranged with precision and without lowering the manufacturing (processing) speed.

A vehicular wiring structure according to an aspect of the present application includes a wired member to be wired on a vehicle, which includes a flat face having an even surface and a non-flat face having an uneven surface; and a printed wiring part arranged on the wired member. In the vehicular wiring structure, the printed wiring part is arranged such that: in the flat face, a conductive member is printed on the flat face directly; and in the non-flat face, a film on which a conductive member is printed is pasted to the non-flat face.

With the vehicular wiring structure according to the aspect of the present application, as an object to be directly printed with the conductive member is a flat face, it is possible to print the conductive member on the flat face precisely and rapidly. Further, in a non-flat face, the printed wiring part is arranged such that the film on which the conductive member is printed is pasted to the non-flat face. In this case, nevertheless, as an object to be printed with the conductive member is the film in a flat state, the printing of the conductive member can be accomplished precisely and rapidly. From above, for the wired member to be wired on the vehicle including the flat faces and the non-flat faces in mixture, it is possible to arrange the printed wiring part with precision and without lowering the manufacturing speed.

DESCRIPTION OF EMBODIMENTS

Vehicular wiring structures according to embodiments will be described with reference to drawings.

First Embodiment

FIGS. 1A to 4 illustrate a vehicular wiring structure according to a first embodiment. In the first embodiment, the vehicular wiring structure is applied to a panel 1 as a wired member to be wired on a vehicle.

Figure 1A:
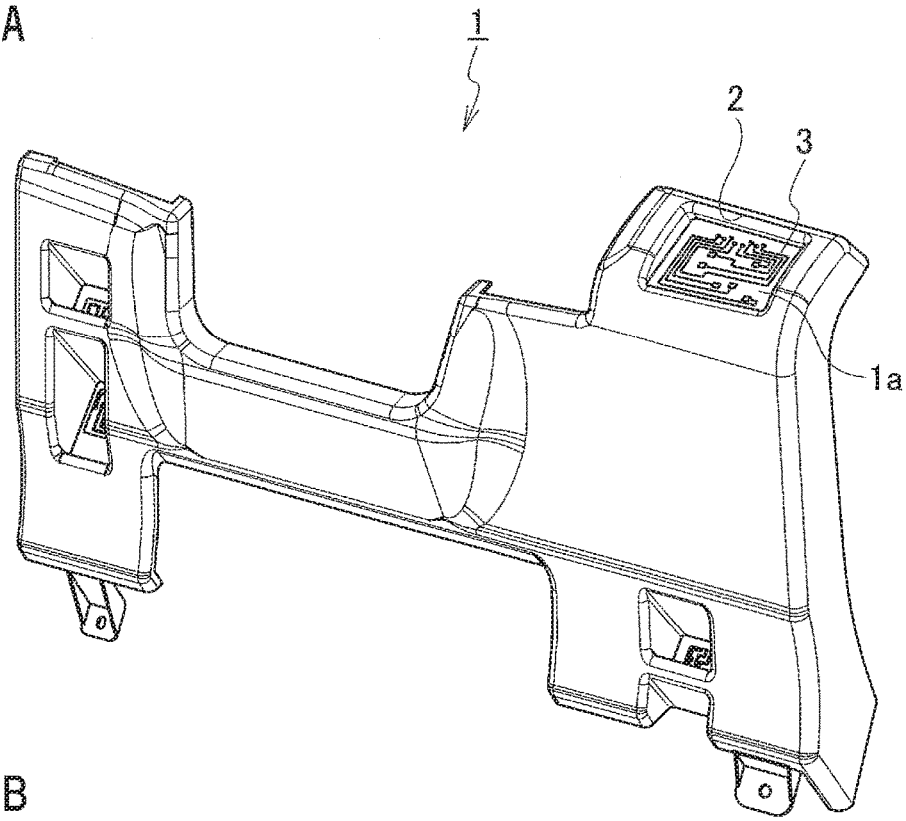
FIG. 1A is a perspective front view of a panel to which a vehicular wiring structure according to a first embodiment is applied.
Figure 1B:
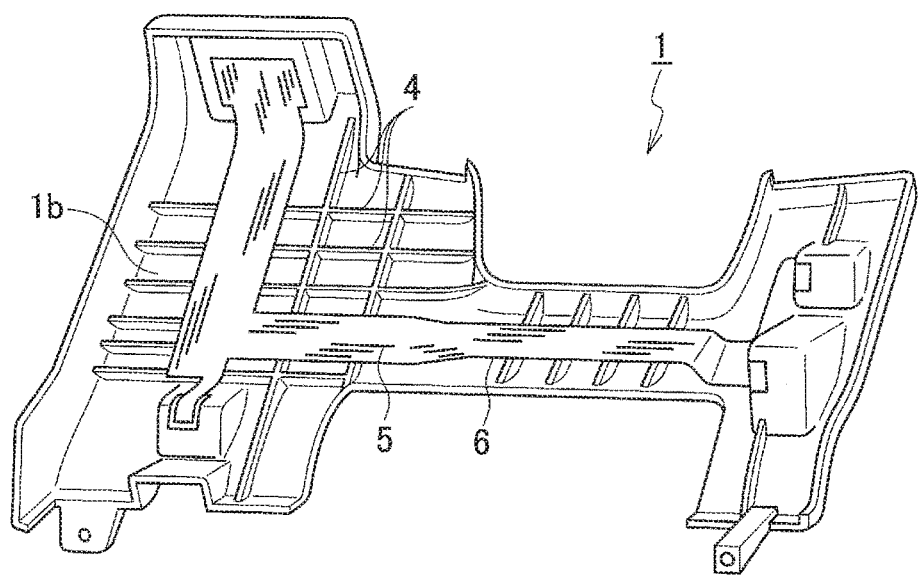
FIG. 1B is a perspective rear view of the panel to which the vehicular wiring structure according to the first embodiment is applied.

As illustrated in FIGS. 1A and 1B, the panel 1 is formed so as to have a curved surface (three-dimensional form) gentle as a whole. Accordingly, the panel 1 is schematically formed with non-flat faces (curved surfaces) each of which is mostly composed of uneven surfaces.

Figure 2:
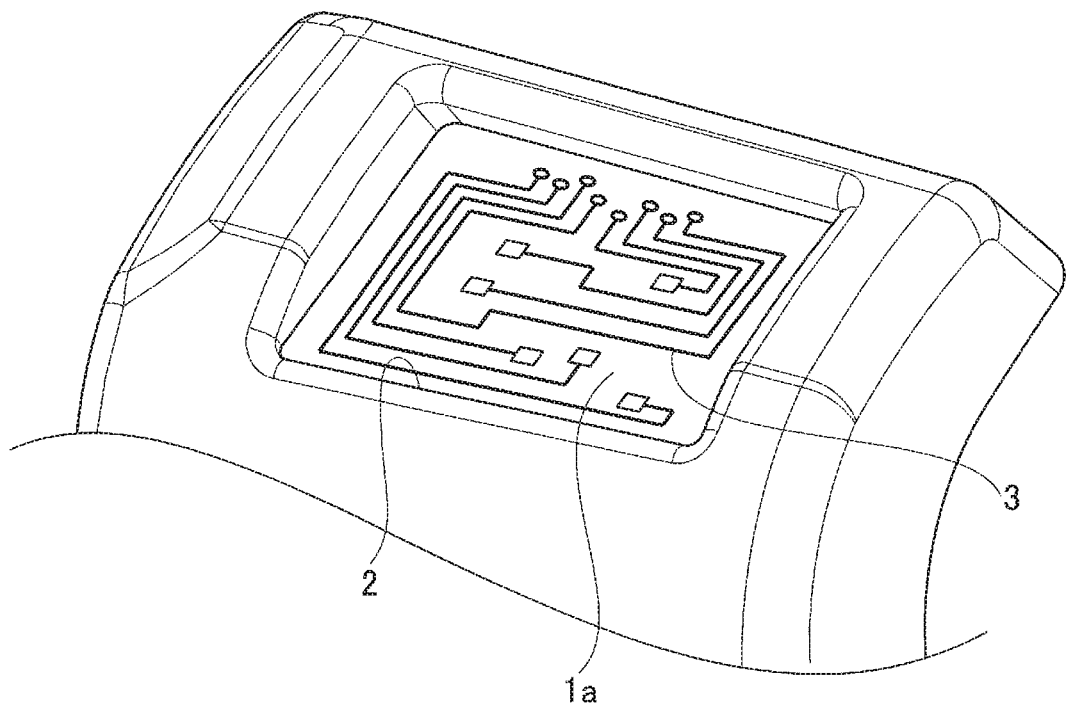
FIG. 2 is an enlarged perspective view of an essential part of a wiring recess on the front side of the panel to which the vehicular wiring structure according to the first embodiment is applied.

As illustrated in FIG. 2, a wiring recess 2 is formed on the surface of the panel 1. The wiring recess 2 is formed so that its bottom surface is lower by one stage than the other surface of the panel 1. The bottom surface of the wiring recess 2 is formed so as to be a flat face 1a composed of an even surface. A first printed wiring part 3 is arranged on the flat face 1a of the wiring recess 2. The first printed wiring part 3 is provided by printing a conductive member (e.g. conductive ink paste) on the flat face 1a directly. For instance, the first printed wiring part 3 is formed by spraying such conductive ink on the flat face 1a from an ink jet nozzle (not illustrated) directly. Due to the flat face 1a, the first printed wiring part 3 can be formed with high density.

As illustrated in FIG. 1B, the panel 1 is provided, nearly over its entire rear surface, with ribs 4 erected in a lattice pattern. Thus, the rear surface of the panel 1 is formed, nearly over its whole area, with a non-flat face 1b composed of an uneven surface. Also, the panel 1 has a second printed wiring part 5 arranged on the non-flat face 1b in the rear surface of the panel 1. The second printed wiring part 5 is provided by pasting a film 6 having a conductive member (e.g. conductive ink paste) printed thereon to the non-flat face 1b of the panel 1. The second printed wiring part 5 is arranged on the non-flat face 1b in the rear surface of the panel 1 so as to straddle the respective ribs 4.

Figure 3:
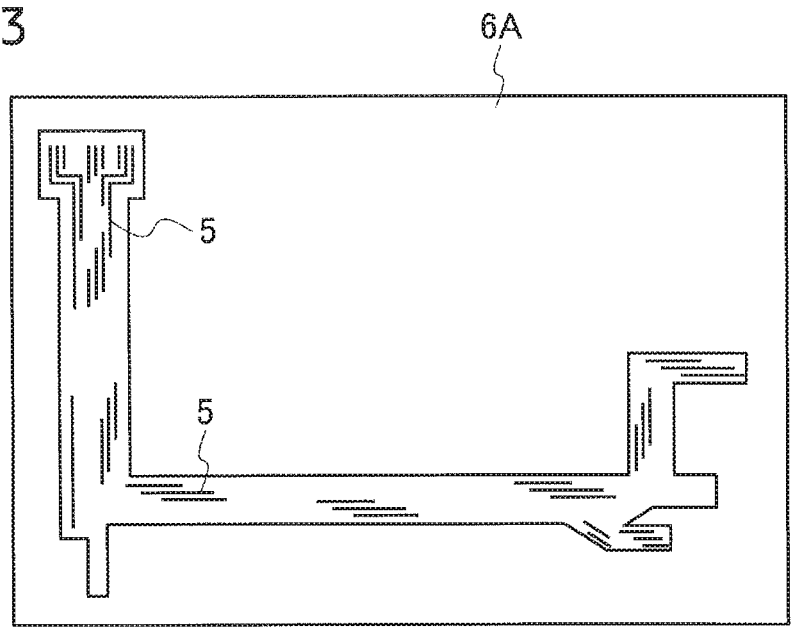
FIG. 3 is a plan view of a film on which a printed wiring part of the vehicular wiring structure according to the first embodiment is printed.
Figure 4:
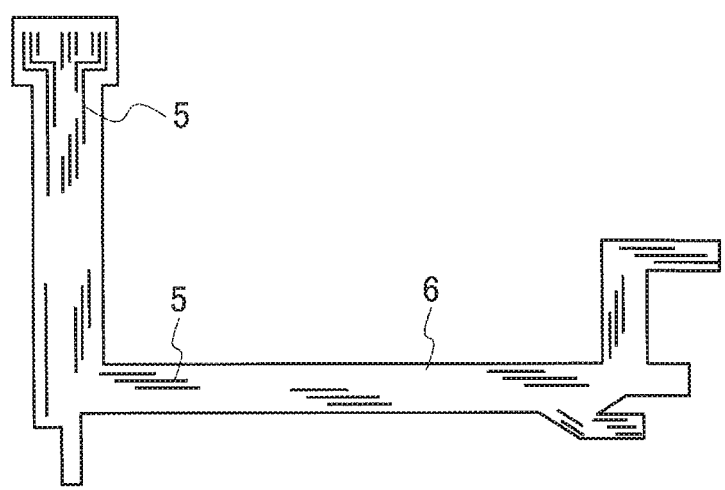
FIG. 4 is a plan view of a film obtained by cutting off an unnecessary portion from the film of FIG. 3 and trimming it.

Next, the manufacturing procedures of the film 6 on which the conductive member (e.g. conductive ink paste) will be described. As illustrated in FIG. 3, it is performed to arrange a square shaped film 6A in a flat state and spray, for example, conductive ink onto the film 6A from an ink jet nozzle (not illustrated) directly, thereby forming the second printed wiring part 5. Next, as illustrated in FIG. 4, it is performed to cut off an unnecessary portion on which the second printed wiring part 5 is not formed, thereby producing the trimmed film 6. In this way, the film 6 on which the conductive member (e.g. conductive ink paste) is completed.

As mentioned above, in the vehicular wiring structure, the first printed wiring part 3 is arranged such that the conductive ink or the like is printed on the flat face 1a on the front-surface side of the panel 1 directly. While, the second printed wiring part 5 is arranged such that the film 6 on which the conductive member is printed is pasted to the non-flat face 1b on the rear-surface side of the panel 1. In short, on the flat face 1a of the panel 1 as the wired member, there is formed the first printed wiring part 3 which is printed on the panel 1 directly. On the other hand, on the non-flat face 1b of the panel 1, there is formed the second printed wiring part 5 which is obtained by pasting the film 6 printed with the conductive member to the non-flat face 1b.

In this way, as the conductive member is printed on the flat face 1a directly, it is possible to print the conductive member precisely and rapidly. On the other hand, although the film 6 having the conductive member printed thereon is pasted on the non-flat face 1b, the printing can be carried out precisely and rapidly since the conductive member is printed on the film 6 in a flat state. From above, in the panel 1 including the flat face 1a and the non-flat face 1b in mixture, the first printed wiring part 3 and the second printed wiring part 5 can be arranged with precision and without lowering the manufacturing (processing) speed.

In the first embodiment, repeatedly, the first printed wiring part 3 is arranged on the front-surface side of the panel 1, while the second printed wiring part 5 is arranged on the rear-surface side of the panel 1. However, in a modification, the first printed wiring part 3 and the second printed wiring part 5 may be arranged on an identical surface (i.e. either the front surface or rear surface).

Second Embodiment

FIGS. 5 and 6A to 6C illustrate a vehicular wiring structure according to a second embodiment. In the second embodiment, the vehicular wiring structure is applied to the panel 1 as a wired member to be wired on a vehicle, and conductive member (e.g. conductive ink paste) is directly printed on a panel portion where ribs 4 are erected.

Figure 5:
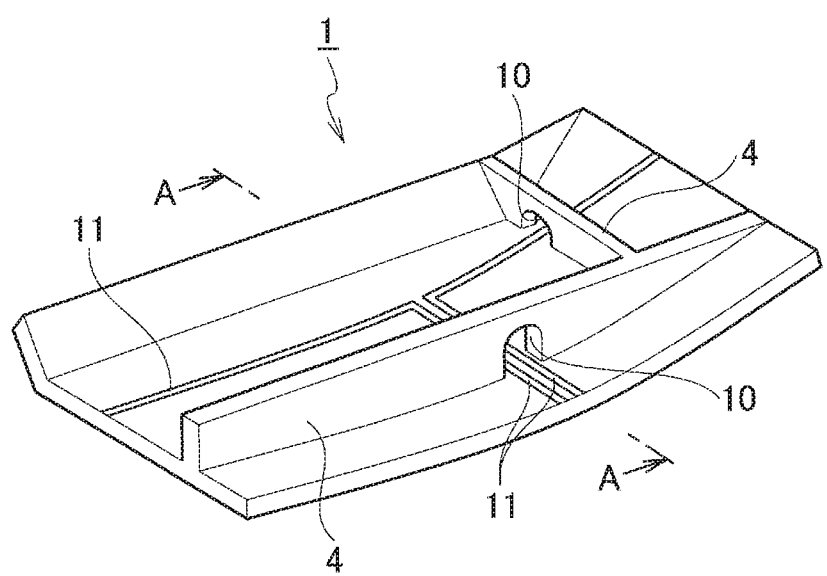
FIG. 5 is a perspective view of an essential part of a panel portion with standing ribs in the wiring structure according to a second embodiment.

As illustrated in FIG. 5, the ribs 4 are erected on the rear-surface side of the panel 1. Each of the ribs 4 is provided with a hole 10. The hole 10 is formed so that its inner circumferential surface is same plane with the rear surface of the panel 1.

Figure 6A:
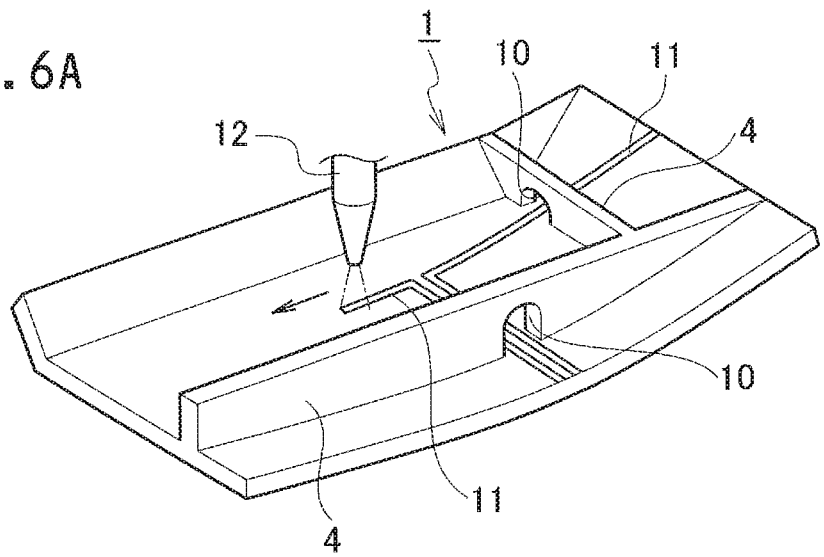
FIG. 6A is a view illustrating the process of forming the printed wiring part by spraying conductive ink from a nozzle in the vehicular wiring structure according to the second embodiment.
Figure 6B:
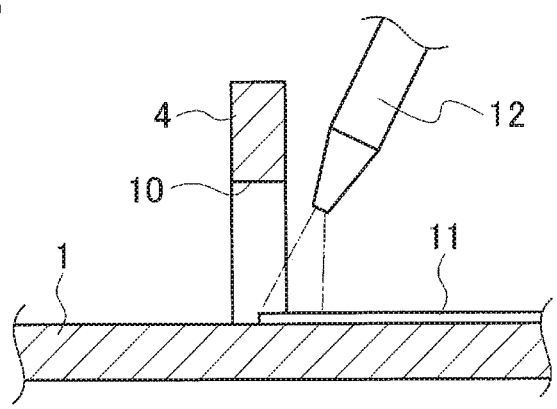
FIGS. 6B and 6C are views illustrating the process of forming the printed wiring part for a wiring portion penetrating through a rib in the vehicular wiring structure according to the second embodiment.
Figure 6C:
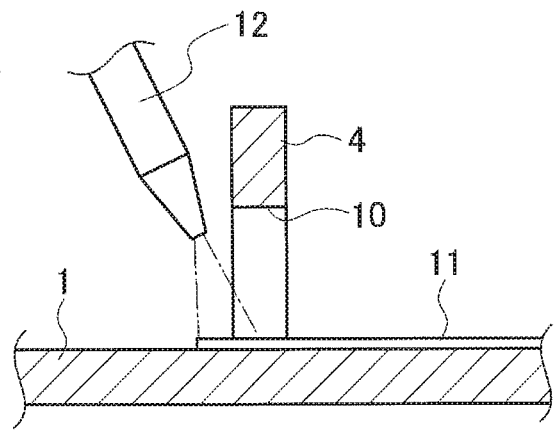

In printed wiring parts 11, as illustrated in FIG. 6A, wiring paths penetrating through the ribs 4 are formed by directly printing conductive member (conductive ink paste or the like) on the inner circumferential surface of the holes 11. The printing onto the inner circumferential surface of each hole 10 can be accomplished by not making an angle of an ink jet nozzle 12 positioned close to each side of the hole 10 perpendicular to the rear surface of the panel 1 but inclining the above angle to the rear surface, as illustrated in FIGS. 68 and 6C.

According to the second embodiment, in the wiring paths intersecting with the ribs 4, the printed wiring parts 11 can be formed in the wiring paths of the shortest distances without dividing the ribs 4 and with ease. As the continuous ribs 4 are not divided into pieces, the strength of the panel 1 as a structural body is hardly lowered.

Figure 7:
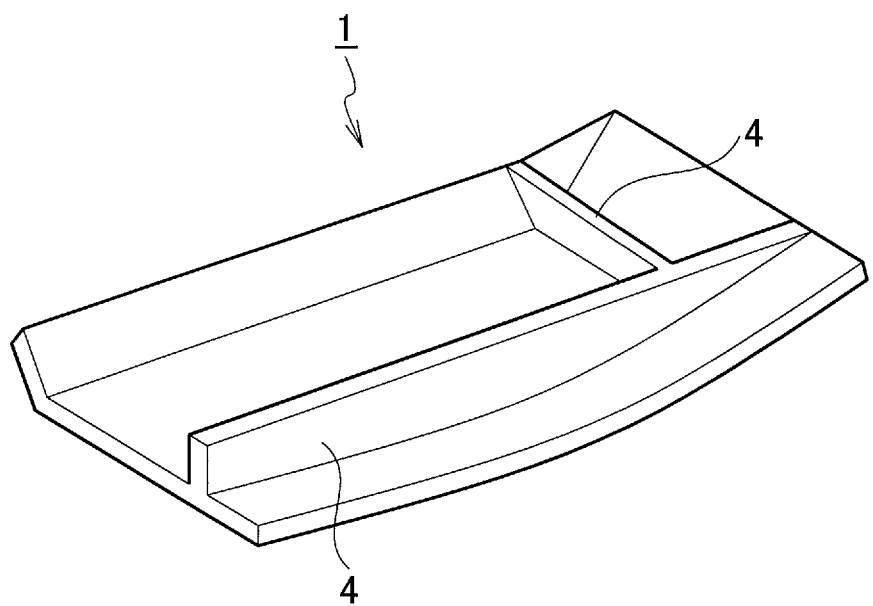
FIG. 7 is a view explaining a comparative example 1.

Conventionally, as illustrated with the comparative example 1 of FIG. 7 (as the similar art JP 2006-076020 A), in case of forming the printed wiring parts 11 on the surface having the ribs 4 erected thereon by means of printing, the wiring paths intersecting with the ribs 4 have been formed by printing the printed wiring parts 11 as if they had traced respective surfaces of the ribs 4. However, if the wiring path are formed in this way, the distances of the wiring paths become elongated and additionally, there is need of printing the printed wiring parts 11 while changing an angle of an ink jet nozzle, so that the printed wiring parts 11 cannot be formed easily. Alternatively, although it may be expected to form in the printed wiring parts 11 in the form of wiring paths bypassing the ribs 4, there is also a case that they cannot bypass the ribs 4. Or, even when the wiring paths could bypass the ribs 4, the distances of the wiring paths would become elongated remarkably. In this situation, the second embodiment is intended to solve the above-mentioned problems. Thus, according to the second embodiment, in the wiring paths intersecting with the ribs 4, the printed wiring parts 11 can be formed in the wiring paths of the shortest distances without dividing the ribs 4 and with ease.

Third Embodiment

Figure 8:
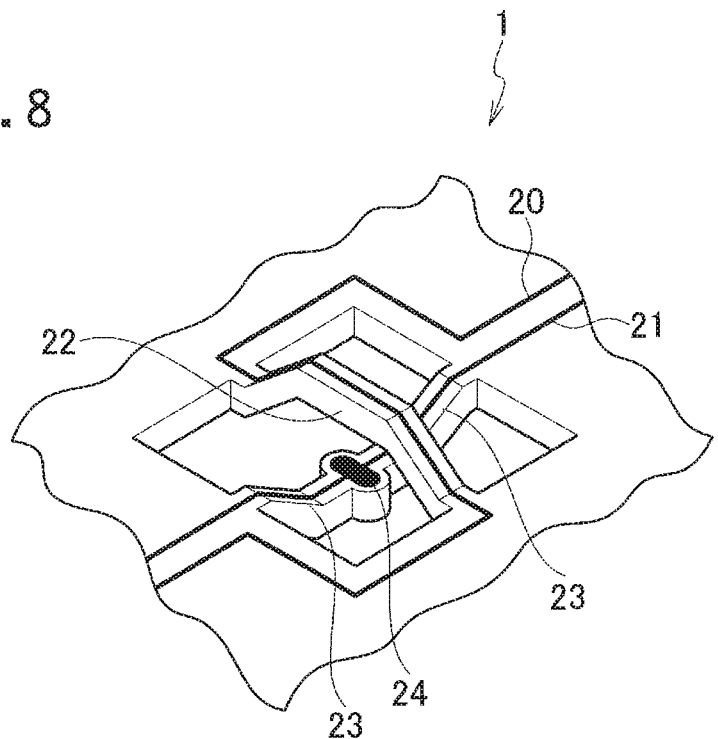
FIG. 8 is a perspective view of an essential part of a panel portion on which overhead-crossing printed wiring parts are formed, in the vehicular wiring structure according to a third embodiment.
Figure 9:
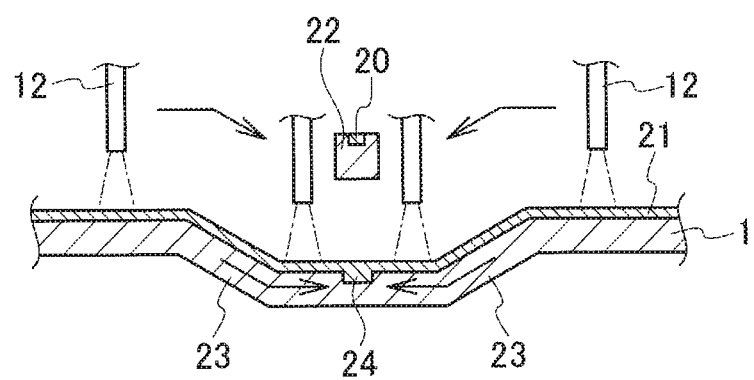
FIG. 9 is a view illustrating the process of forming the printed wiring part by spraying conductive ink from nozzles in the vehicular wiring structure according to the third embodiment.

FIGS. 8 and 9 illustrate a vehicular wiring structure according to a third embodiment. In the third embodiment, the vehicular wiring structure is applied to the panel 1 as a wired member to be wired on a vehicle, and additionally, the conductive member (conductive ink paste or the like) is directly printed in the wiring paths which allow a first printed wiring part 20 and a second printed wiring part 21 to intersect with each other without allowing them to have electrical continuity to each other.

As illustrated in FIG. 8, the panel 1 is provided with a bridge part 22, both ends of which are supported by the panel 1, and slanted surfaces 23 which are formed so as to pinch the bridge part 22 from both sides and occupy their lowermost position just below the bridge part 22. In other words, the panel 1 is provided with the slanted surfaces 23 which are slanted toward the center side gradually and the bridge part 22 which traverses above (straddles) the slanted surfaces 23.

An ink reservoir 24 is formed in a position immediately below the bridge part 22.

The first printed wiring part 20 to be wired in the path passing through the bridge part 22 is arranged such that the conductive member (conductive ink paste) is printed on the bridge part 22 directly. As illustrated in FIG. 9, the second printed wiring part 21 to be wired in the path passing below the bridge part 22 is arranged such that the conductive ink is directly sprayed on the slanted surfaces 23 and subsequently allowed to flow downward on the slanted surfaces 23 on both sides due to its fluidity immediately after being sprayed onto the slanted surfaces 23, and finally converge in the ink reservoir 24 just below the bridge part 22. In this way, grade-separated wiring paths are formed. Further, if the flowage pattern of conductive ink immediately after being sprayed and the printed wiring form just below the bridge part 22 can be controlled, it is unnecessary to provide the ink reservoir 24.

Figure 10:
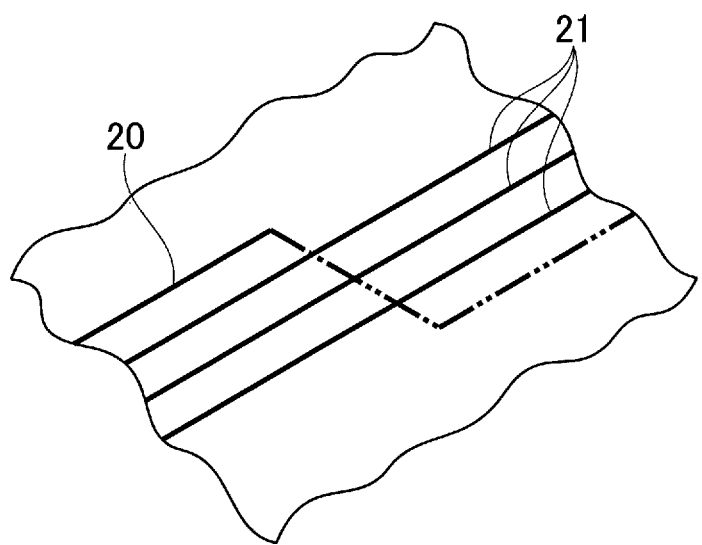
FIG. 10 is a view explaining a comparative example 2.

Conventionally, as illustrated with the comparative example 2 of FIG. 10, it is difficult to directly print the conductive members in the wiring paths to cross the first printed wiring part 20 and the second printed wiring part 21 without allowing them to have electrical continuity to each other. In other words, in the arrangement of the first printed wiring part 20 and the second printed wiring part 21, it is difficult to exchange the relative positions of the first printed wiring part 20 and the second printed wiring part 21. In this situation, the third embodiment is intended to solve such a problem and make it possible to form the grade-separated wiring paths with the use of means of printing the conductive members directly.

Fourth Embodiment

Figure 11:
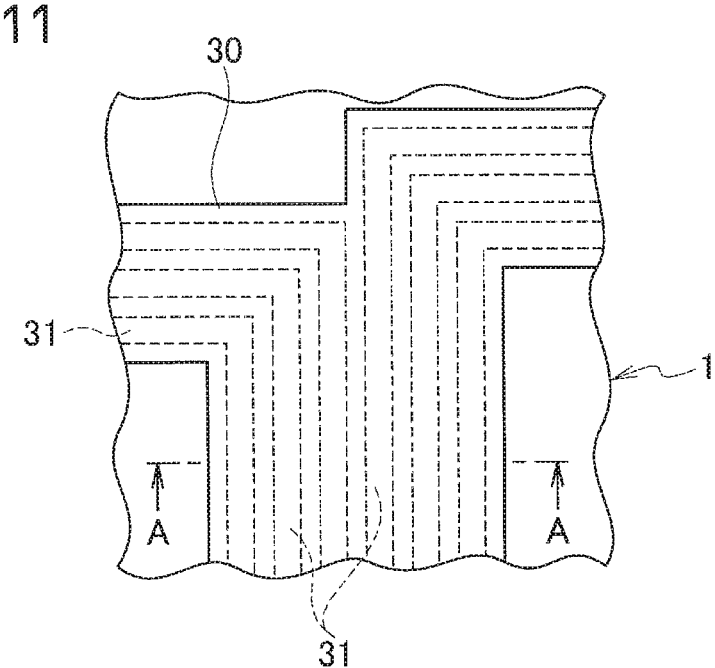
FIG. 11 is a plan view of a panel where a duct is arranged above the printed wiring parts in the vehicular wiring structure according to a fourth embodiment.
Figure 12:
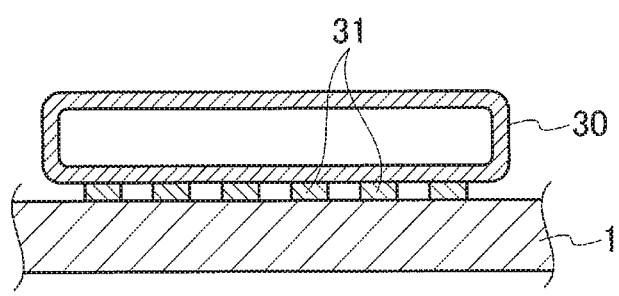
FIG. 12 is a sectional view taken along a line A-A of FIG. 11.

FIGS. 11 and 12 show the vehicular wiring structure according to a fourth embodiment. According to the fourth embodiment, in the arrangement where an air conditioning duct 30 is arranged in the vicinity of the panel 1 as a wired member to be wired on a vehicle, the air conditioning duct 30 is overlaid on the upper surfaces of printed wiring parts 31 to protect them. Therefore, there is no need of covering the upsides of the printed wiring parts 31 by a protective film, coating, or the like, thereby reducing the number of components and the manufacturing cost.

Figure 13A:
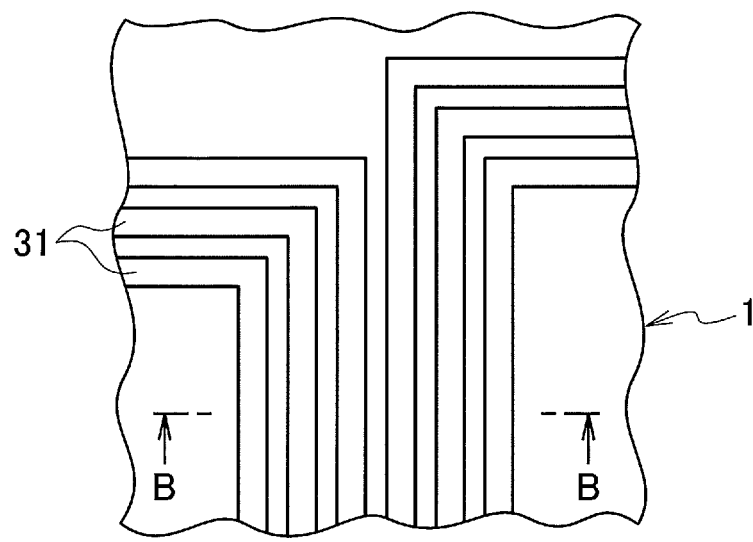
FIG. 13A is a plan view of a panel where a protective layer is arranged above the printed wiring parts, also explaining a comparative example 3.
Figure 13B:
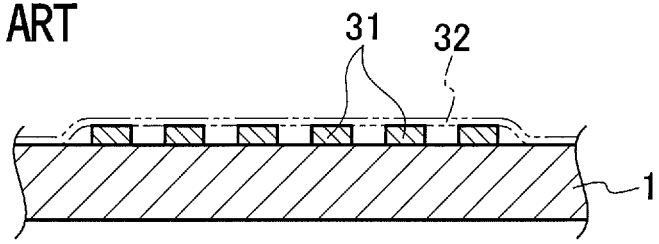
FIG. 13B is a sectional view taken along a line B-B of FIG. 13A.

Conventionally, as illustrated with the comparative example 3 of FIG. 13, if arranging the printed wiring parts 31 on the top surface of the panel 1, there arises a problem of increasing the number of components and the manufacturing cost since the printed wiring parts 31 have to be covered with a protective layer 32, such as protective film or coating. In this situation, the fourth embodiment is intended to solve the above-mentioned problem and thus reduce the number of components and the manufacturing cost since there is no need of covering the upsides of the printed wiring parts 31 with the protective film or coating.

Fifth Embodiment

FIGS. 14A to 16B illustrate a vehicular wiring structure according to a fifth embodiment. In the fifth embodiment, the vehicular wiring structure is applied to the panel 1 as a wired member to be wired on a vehicle, and additionally, the conductive members (e.g. conductive ink paste) are printed on a panel portion including an area provided with the ribs 4, directly.

Figure 14A:
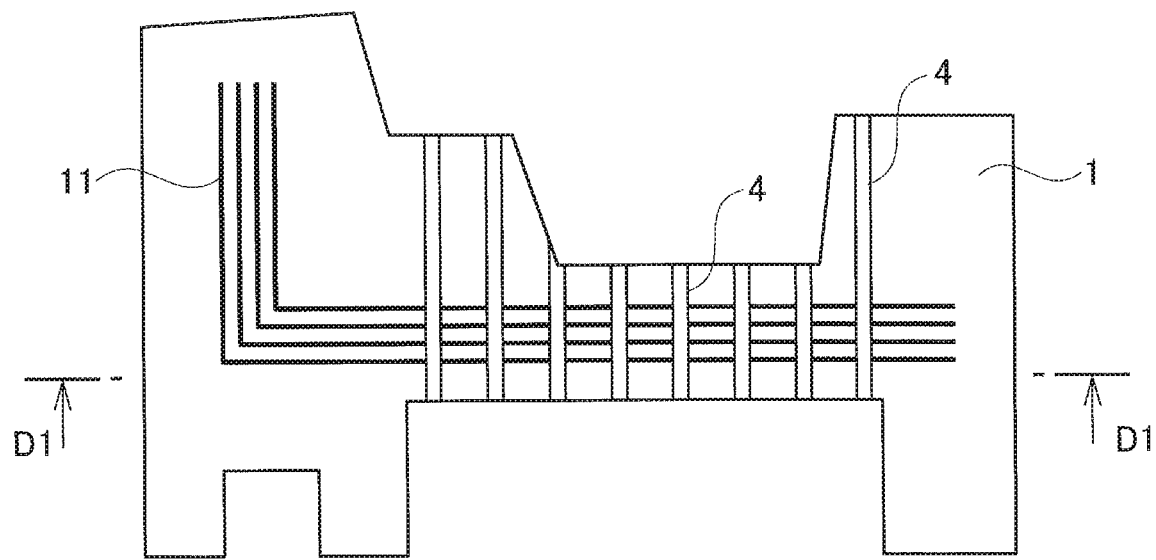
FIG. 14A is a reverse side view of a panel formed with printed wiring parts of the vehicular wiring structure according to a fourth embodiment.
Figure 14B:
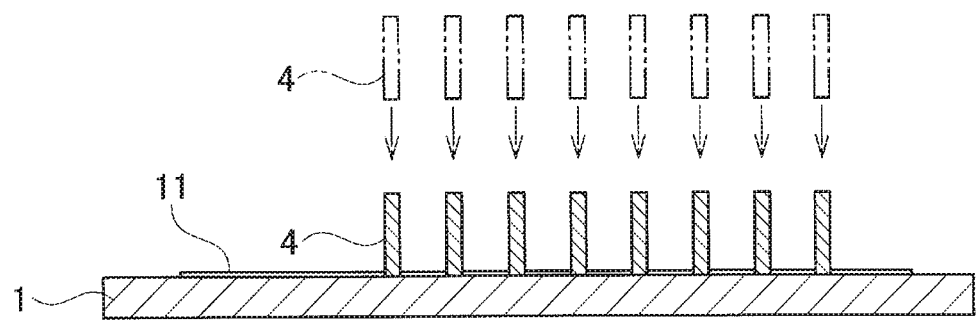
FIG. 14B is a sectional view taken along a line D1-D1 of FIG. 14A.

As illustrated in FIGS. 14A and 14B, the ribs 4 are provided on the rear-surface side of the panel 1. In printed wiring parts 11, wiring paths penetrating through the ribs 4 are formed by directly printing conductive members (conductive ink paste or the like).

Figure 15A:
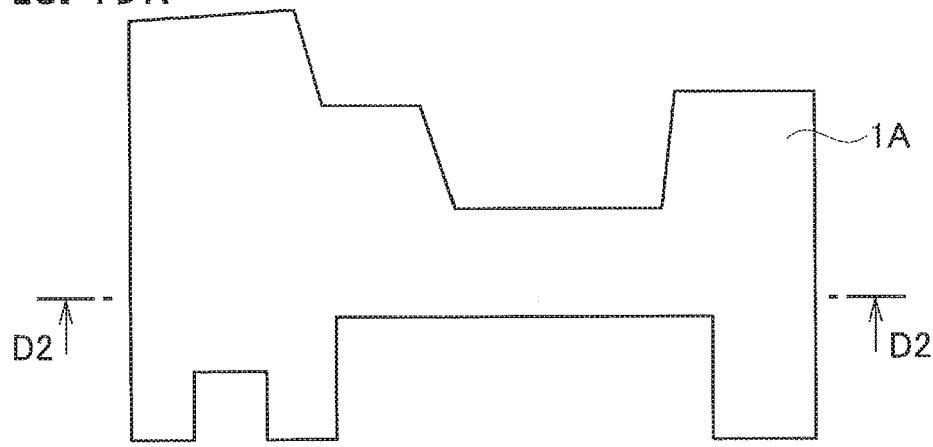
FIG. 15A is a reverse side view explaining the manufacturing process of the panel formed with the printed wiring parts of the vehicular wiring structure according to the fourth embodiment.
Figure 15B:
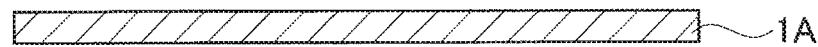
FIG. 15B is a sectional view taken along a line D2-D2 of FIG. 15A.

Next, the manufacturing procedures of the printed wiring parts 11 will be described. As illustrated in FIGS. 15A and 15B, for an area to be provided with the printed wiring parts 11, a panel 1A having a flat face without the rib 4 is prepared by injection molding or vacuum molding.

Figure 16A:
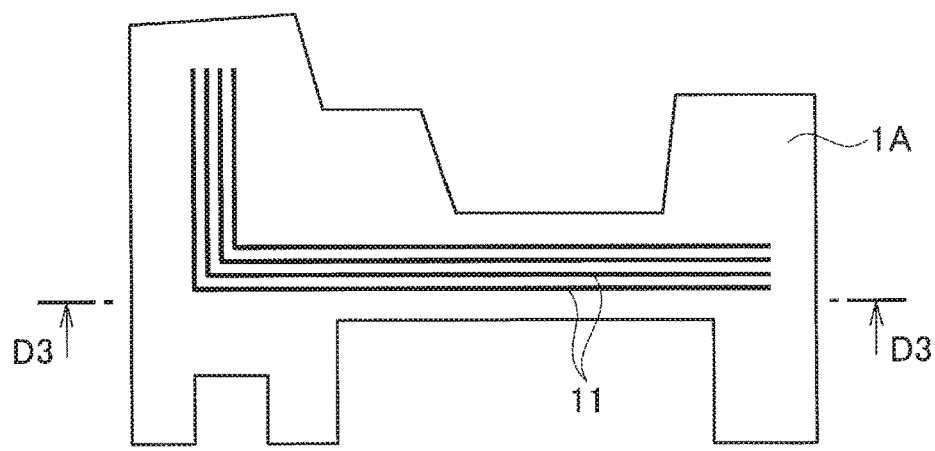
FIG. 16A is a reverse side view explaining the manufacturing process of the panel formed with the printed wiring parts of the vehicular wiring structure according to the fourth embodiment.
Figure 16B:
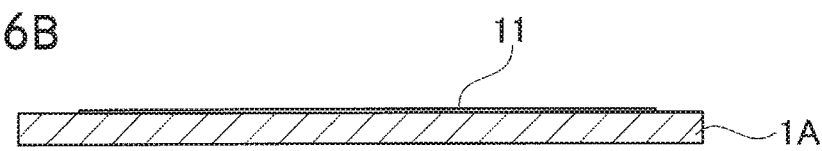
FIG. 16B is a sectional view taken along a line D3-D3 of FIG. 16A.

Next, it is performed to print the conductive member (e.g. conductive ink paste) onto the flat face of the panel 1A, thereby forming the printed wiring parts 11 as illustrated in FIGS. 16A and 16B. Thus, the printing can be accomplished by not inclining an angle of an ink jet nozzle (not illustrated) to the panel 1A but making the angle of the ink jet nozzle generally perpendicular to the panel 1A.

Then, as illustrated with imaginary lines of FIG. 14B, the ribs 4 are fixed to the printed wiring parts 11 of the panel 1 by means of adhering. In this way, the manufacturing of the panel 1 formed with the printed wiring parts 11 is completed.

According to the fifth embodiment, in the wiring paths intersecting with the ribs 4, the printed wiring parts 11 can be formed in the wiring paths of the shortest distances without dividing the ribs 4 and with ease. As the continuous ribs 4 are not divided into pieces, the strength of the panel 1 as a structural body is hardly lowered.

Conventionally, as illustrated with the comparative example 1 of FIG. 7 (as the similar art JP 2006-076020 A), in case of forming the printed wiring parts 11 on the surface provided with the ribs 4 by means of printing, the wiring paths intersecting with the ribs 4 have been formed by printing the printed wiring parts 11 as if they had traced respective surfaces of the ribs 4. However, if the wiring paths are formed in this way, the distances of the wiring paths become elongated, and additionally, there is need of printing the printed wiring parts 11 while changing an angle of an ink jet nozzle, so that the printed wiring parts 11 cannot be formed easily. Alternatively, although it may be expected to form the printed wiring parts 11 in the form of wiring paths bypassing the ribs 4, there is also a case that they cannot bypass the ribs 4. Or, even when the wiring paths could bypass the ribs 4, the distances of the wiring paths would become elongated remarkably. In this situation, the fifth embodiment is intended to solve the above-mentioned problems. Thus, according to the fifth embodiment, in the wiring paths intersecting with the ribs 4, the printed wiring parts 11 can be formed in the wiring paths of the shortest distances without dividing the ribs 4 and with ease.

In a modification of the fifth embodiment, the panel 1A may be formed, in recesses, with wiring paths on which conductive member (conductive ink paste or the like) is to be printed. Then, the printed wiring parts 11 may be provided by printing the conductive member (conductive ink paste or the like) on the recesses.

First Reference Example

Figure 17:
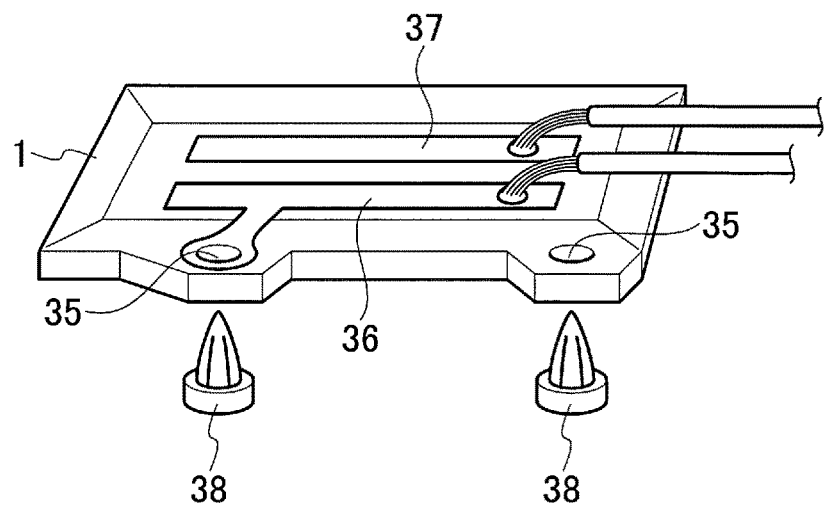
FIG. 17 is a perspective view explaining a first reference example of the embodiment
Figure 18A:
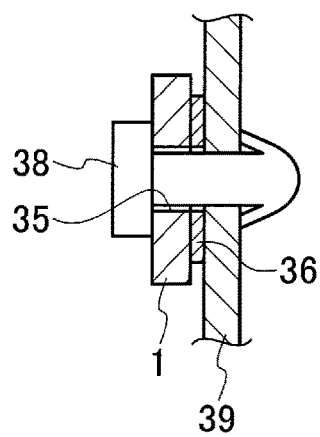
FIG. 18A is a sectional view explaining the first reference example of the embodiment.
Figure 18B:
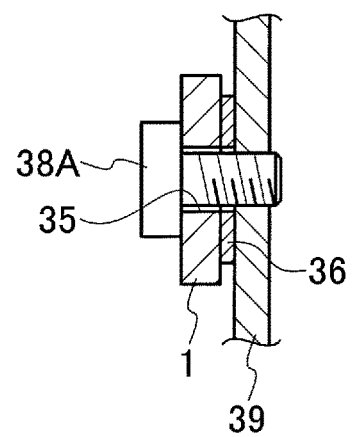
FIG. 18B is a sectional view explaining a modification of the first reference example of the embodiment.

FIGS. 17 to 18B illustrate a first reference example for the embodiments. The panel 1 as a wired member to be wired on a vehicle is formed with attachment holes 35. The panel 1 is also formed with printed wiring parts 36, 37. The printed wiring part 36 on an earth side is also formed around the attachment hole 35 on one side.

As illustrated in FIG. 18A, when the panel 1 is fixed to a vehicle body 39 by metal clips 38 with the use of the attachment holes 35, the printed wiring part 36 on the earth side is electrically connected to the vehicle body 39 through the metal clip 38. Thus, there is no need of carry out the earth connecting work separately. As illustrated with a modification of FIG. 18B, a metal bolt 38A may be used in pace of the metal clip 38.

Figure 19:
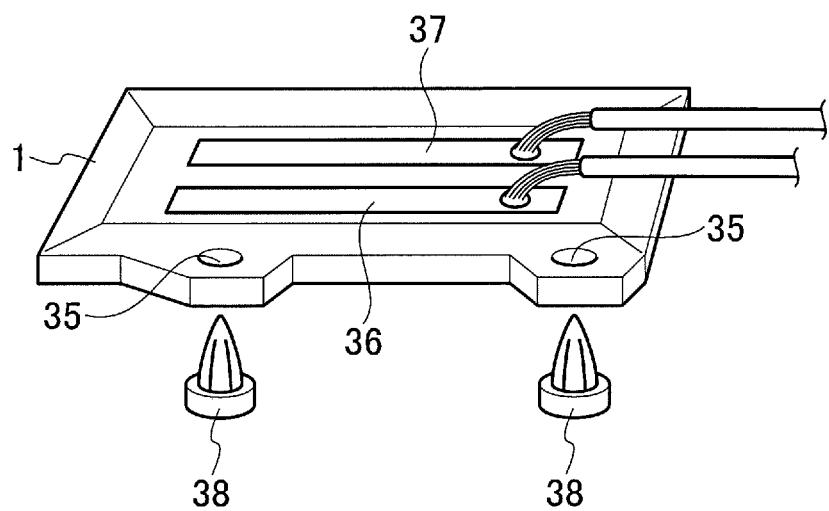
FIG. 19 is a perspective view explaining a comparative example 4.

That is, as illustrated with the comparative example 4 of FIG. 19, when attaching the panel 1 to the vehicle body 39 and further earth-connecting the printed wiring part 36 to the vehicle body 39, it has been required to perform the attaching work to attach the panel 1 to the vehicle body 39 and the earth-connecting work to ground the panel 1 to the vehicle body 39 individually, thereby raising a problem of such unfavorable workability. The first reference example is intended to solve such a problem and eliminate the need of performing the earth-connecting work by only performing the attaching work to attach the panel 1 to the vehicle body 39.

Second Reference Example

Figure 20A:
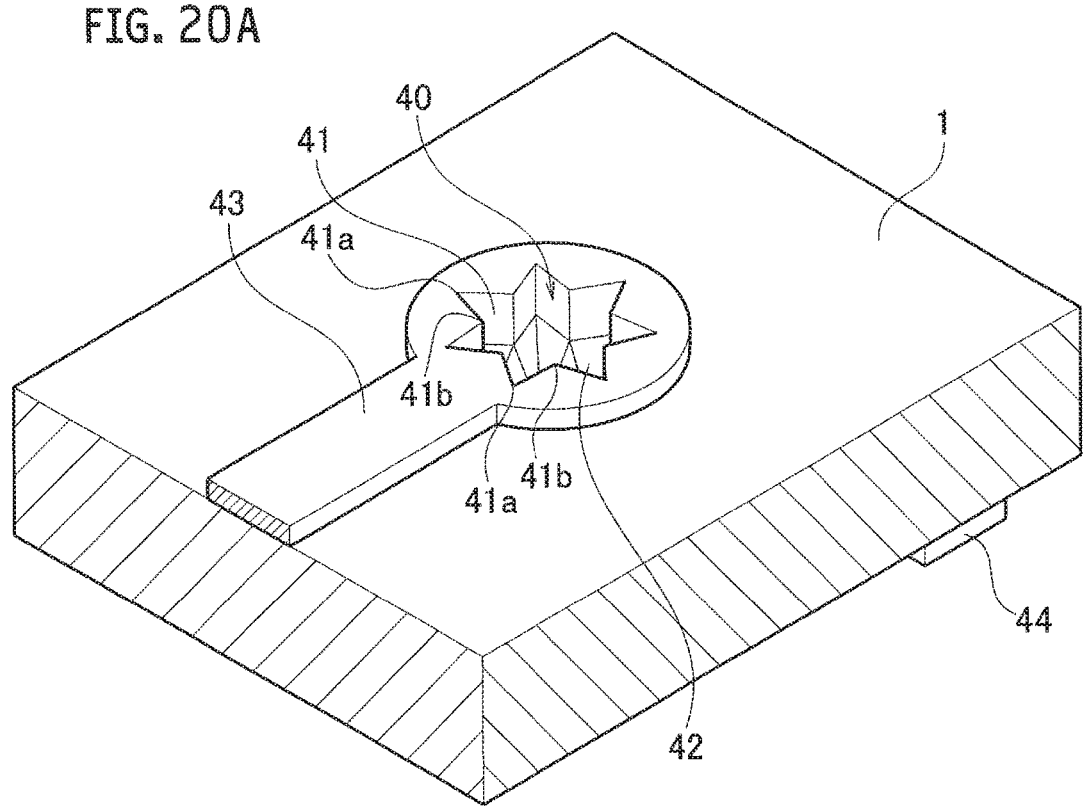
FIG. 20A is a perspective view of an essential part of a panel in a second reference example of the embodiment.
Figure 20B:
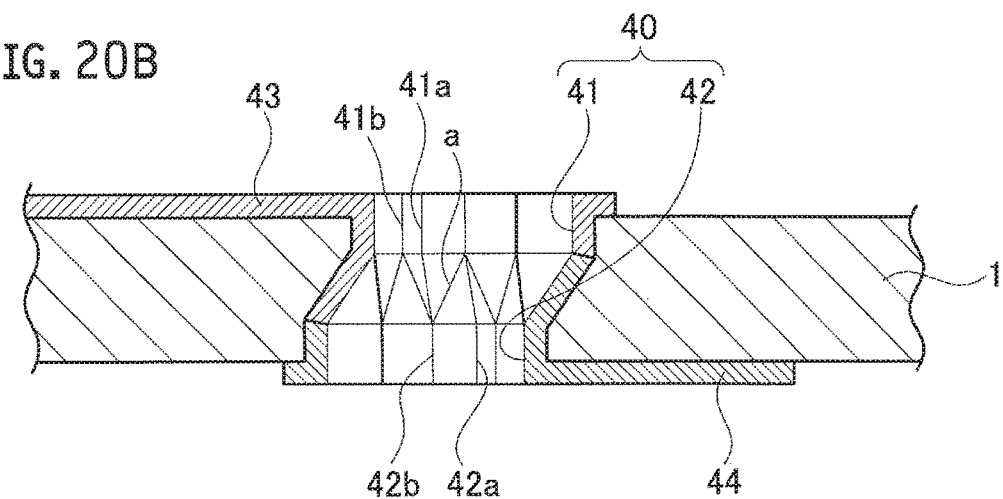
FIG. 20B is a sectional view of a through-hole portion of the panel in the second reference example of the embodiment.
Figure 21:
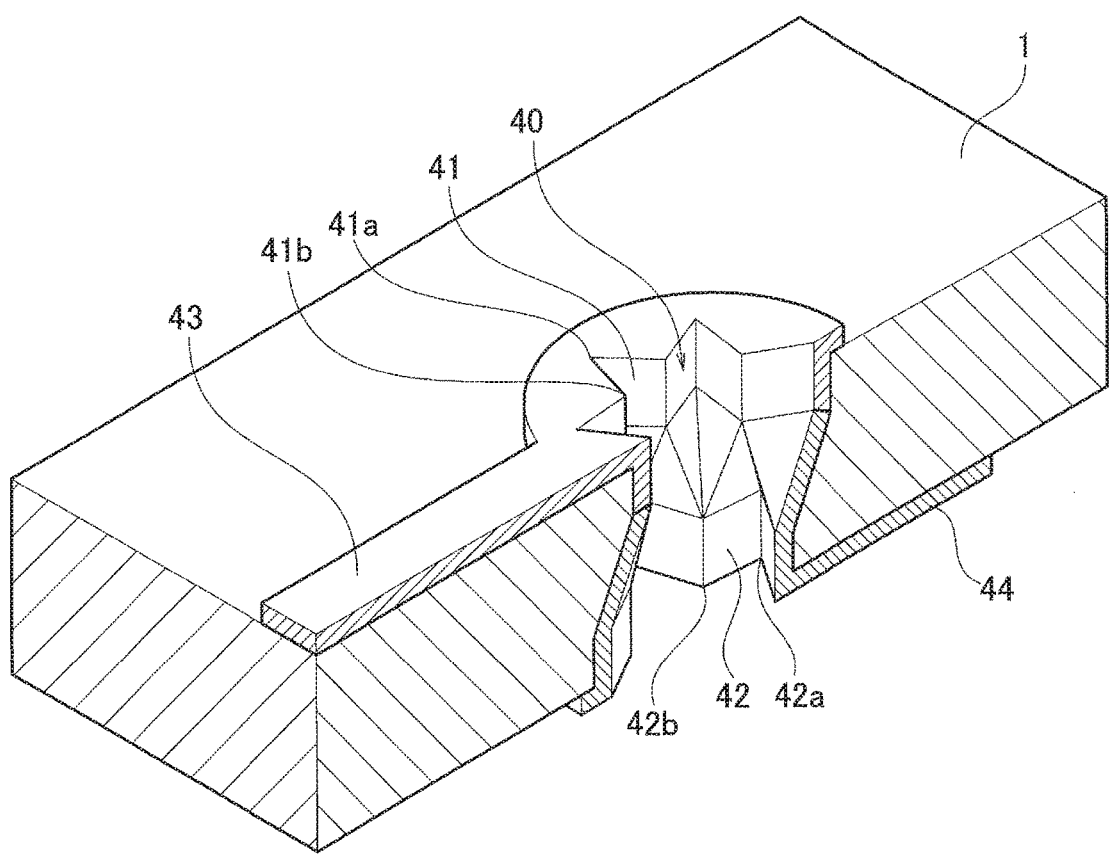
FIG. 21 is a sectional perspective view of a through-hole, illustrating the second reference example of the embodiment.

FIGS. 20 and 21 illustrate a second reference example for the embodiments. The panel 1 as a wired member to be wired on a vehicle is formed with a through-hole 40. The through-hole 40 includes a star-shaped polygonal first hole part 41 opened to one surface (front surface) of the panel 1 and a star-shaped polygonal second hole part 42 opened to the other surface (rear surface) of the panel 1. In a plane vision of the panel 1, the positions of respective corners 41a, 41b of the inner circumferential surface of the first hole part 41 are deviated from the positions of respective corners 42a, 42b of the inner circumferential surface of the second hole part 42 in the circumferential direction of the through-hole 40. In other words, the first hole part 41 and the second hole part 42 are positioned so that their phases in the rotational direction about their center axes are shifted from each other. Additionally, inside the through-hole 40, the inner circumferential surface of the first hole part 41 is connected to the inner circumferential surface of the second hole part 42 through triangular surfaces which are defined by connecting the apexes of the corners 41a, 41b with the apexes of the corners 42a, 42b through straight lines.

The panel 1 is provided with a printed wiring part 43 on the front-surface side and a printed wiring part 44 on the rear-surface side. These printed wiring parts 43, 44 on both sides are formed on the periphery of the through-hole 40 and also the inner circumferential surface of the through-hole 40. The printed wiring parts 43, 44 on both sides are electrically connected to each other inside the through-hole 40. Due to the above-mentioned formation of the inner circumferential surface of the through-hole 40, both joint surfaces of the printed wiring part 43 and the printed wiring part 44 are shaped of zigzag waves "a", thereby causing the length of a joint part interposed between the wiring parts 43, 44 to be increased. Consequently, the reliability of a connection between the printed wiring part 43 on the front-surface side and the printed wiring part 44 on the rear-surface side is enhanced and additionally, the resistance of a connecting spot can be reduced.

Here, the terminology of polygonal shape related to the hole parts designates a graphic form surrounded by three or more line segments (Le. a graphic form surrounded by a simple polygonal line closed in a planar shape) and also includes a star-shaped polygon as illustrated in the second reference example. Although the hole part may be provided with any polygonal shape other than a star shape, the star-shaped polygon is preferable in view of allowing the resulting joint part to be elongated in length.

Figure 22A:
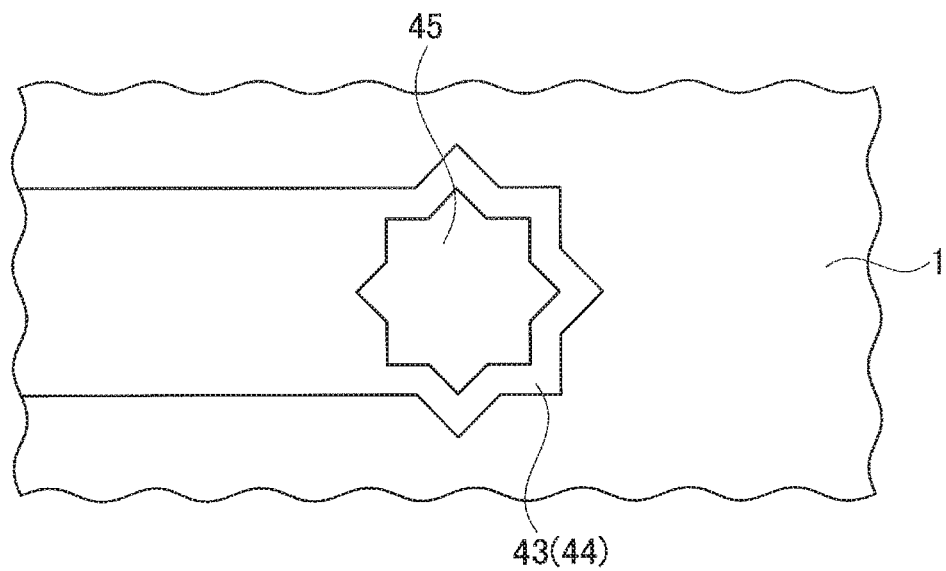
FIG. 22A is a plan view of an essential part of a panel of a comparative example 5.
Figure 22B:
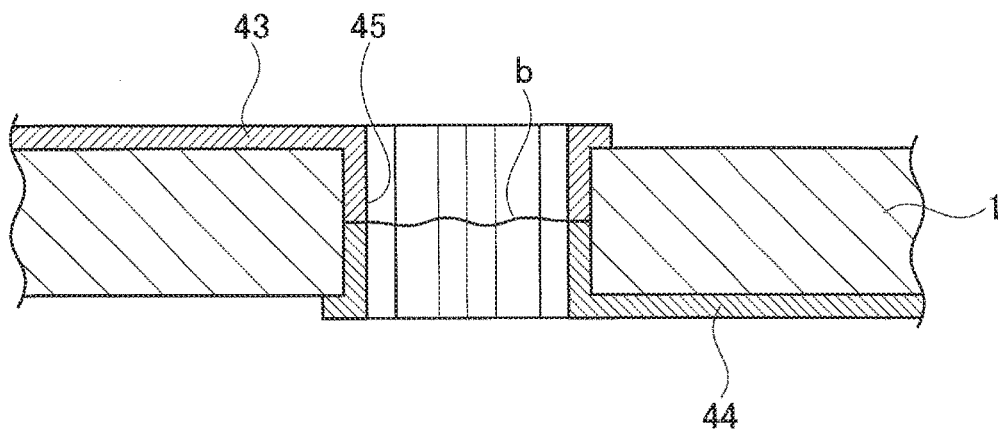
FIG. 22B is a sectional view of a through-hole portion of the panel in the comparative example 5.
Figure 23:
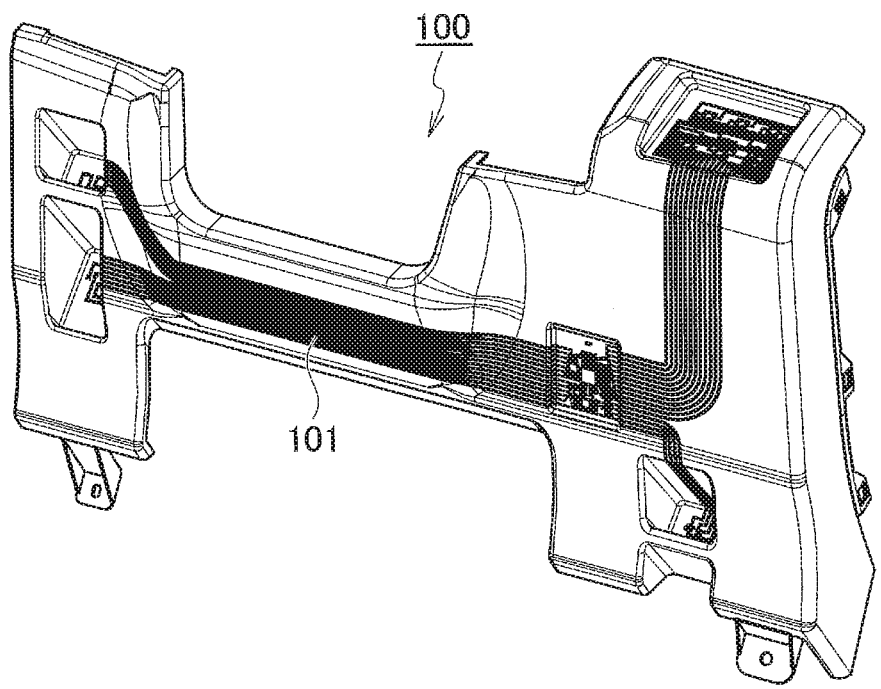
FIG. 23 is a perspective view of an instrument panel to which a printed wiring structure of a conventional example is applied.

As illustrated with the comparative example 5 of FIG. 22, if the panel 1 is provided with a polygonal through-hole 45 having a simple star-shape (That is, the through-hole 45 is shaped so that the apexes of corners of the through-hole 45 on upper and lower surfaces of the panel 1 are positioned in the identical positions, respectively), the circumferential length of the inner circumferential surface of the through-hole 45 can be increased in comparison with the case of forming a simple circular hole, so that the resulting joint part is elongated from this point of view. However, both joint surfaces of the printed wiring part 43 and the printed wiring part 44 are shaped of generally-straight waves "b", so that it is impossible to make the length of a joint part between the wiring parts 43, 44 larger than the circumferential length of the inner circumferential surface of the through-hole 45. The second reference example is intended to solve such a problem and make the length of the joint part between the printed wiring part 43 on the front-surface side and the printed wiring part 44 on the rear-surface side longer sufficiently, thereby enhancing the connecting reliability.

The invention claimed is:

1. A vehicular wiring structure, comprising:
   a wired member to be wired on a vehicle, which comprises a flat face having an even surface and a non-flat face having an uneven surface; and
   a printed wiring part arranged on the wired member, wherein
   the printed wiring part is arranged such that:
   in the flat face, a conductive member is printed on the flat face directly; and
   in the non-flat face, a film on which a conductive member is printed is pasted to the non-flat face.

2. The vehicular wiring structure of claim 1, wherein
   the wired member is provided with a rib,
   the rib is formed with a hole which has an inner circumferential surface having a same plane with a surface of the wired member, and
   the printed wiring part is formed with a wiring path which penetrates through the rib and includes the conductive member printed on the inner circumferential surface of the hole directly.

3. The vehicular wiring structure of claim 1, wherein
   the wired member is provided with a bridge part, both ends of which are supported by the wired member, and slanted surfaces which are formed so as to pinch the bridge part from both sides thereof and occupy the lowermost positions of the slanted surfaces just below the bridge part,
   the printed wiring part in a path passing through the bridge part is arranged such that the conductive member is printed on the bridge part directly, and
   the printed wiring part in a path passing below the bridge part is arranged such that the conductive member is printed on the slanted surfaces directly and subsequently allowed, due to fluidity of the conductive member, to flow downward on the slanted surfaces on both sides and finally converge in an area just below the bridge part, whereby grade-separated wiring paths are formed.

4. The vehicular wiring structure of claim 1, further comprising
   an air conditioning duct arranged on a top surface of the wired member so as to cover the printed wiring part.

* * * * *